(12) United States Patent
Collins

(10) Patent No.: US 10,809,473 B2
(45) Date of Patent: Oct. 20, 2020

(54) PHOTONIC INTEGRATED CIRCUIT

(71) Applicant: Huawei Technologies Co., Ltd., Shenzhen (CN)

(72) Inventor: Tom Collins, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/843,960

(22) Filed: Dec. 15, 2017

(65) Prior Publication Data
US 2018/0172935 A1      Jun. 21, 2018

(30) Foreign Application Priority Data

Dec. 15, 2016  (EP) .................................... 16204372

(51) Int. Cl.
| | | |
|---|---|---|
| *G02B 6/42* | (2006.01) | |
| *G02B 6/122* | (2006.01) | |
| *G02B 6/43* | (2006.01) | |
| *H01L 21/683* | (2006.01) | |
| *H01L 23/48* | (2006.01) | |

(Continued)

(52) U.S. Cl.
CPC ............ *G02B 6/4298* (2013.01); *G02B 6/122* (2013.01); *G02B 6/136* (2013.01); *G02B 6/43* (2013.01); *H01L 21/6836* (2013.01); *H01L 23/48* (2013.01); *G02B 2006/12061* (2013.01); *G02B 2006/12107* (2013.01); *G02B 2006/12121* (2013.01)

(58) Field of Classification Search
None
See application file for complete search history.

(56) References Cited

U.S. PATENT DOCUMENTS

| | | | |
|---|---|---|---|
| 6,690,845 B1 | 2/2004 | Yoshimura et al. | |
| 2002/0097962 A1* | 7/2002 | Yoshimura ............... | G02B 6/10 |
| | | | 385/50 |

(Continued)

FOREIGN PATENT DOCUMENTS

| | | |
|---|---|---|
| CN | 102498424 A | 6/2012 |
| WO | 2016011002 A1 | 1/2016 |

OTHER PUBLICATIONS

Dhoore et al., "Novel adiabatic tapered couplers for active III-V/SOI devices fabricated through transfer printing," Optics Express, vol. 24, No. 12, XP002770904, Optical Society of America (Jun. 2016).

(Continued)

*Primary Examiner* — Chad H Smith
(74) *Attorney, Agent, or Firm* — Leydig, Voit & Mayer, Ltd.

(57) ABSTRACT

A photonic integrated circuit comprises a substrate and a passive layer, which is formed on the substrate and incorporates a passive photonic device. The circuit also comprises a layer of III-V material. The layer of III-V material is arranged in a recess of the passive layer and incorporates an active photonic device. The layer of III-V material is configured such that light can be transferred between the passive photonic device and the active photonic device. This photonic integrated circuit provides the advantages of an active device formed from III-V material in an arrangement that is easily planarized, which enables close integration between the active device and electronic components.

17 Claims, 8 Drawing Sheets

(51) Int. Cl.
    *G02B 6/136*   (2006.01)
    *G02B 6/12*    (2006.01)

(56) References Cited

U.S. PATENT DOCUMENTS

2005/0053319 A1    3/2005   Doan
2011/0052114 A1    3/2011   Bernasconi et al.
2016/0327737 A1*   11/2016  Zhang .................... G02B 6/136

OTHER PUBLICATIONS

Marchena et al., "Intergrated Tunable CMOS Laser for Si Photonics", Optical Fiber Communication Conference and Exposition and the National Fiber Optic Engineers Conference(OFC/NFOEC), XP032678882, Institute of Electrical and Electronics Engineers, (Mar. 17-21, 2013).

Groote et al., "Transfer-printing-based integration of single-mode waveguide-coupled III-V-on-silicon broadband light emitters," Optical Express, vol. 24, No. 13, XP002770905, Optical Society of America (Jun. 2016).

CN/201711196284.6, Office Action, dated May 20, 2019.

\* cited by examiner

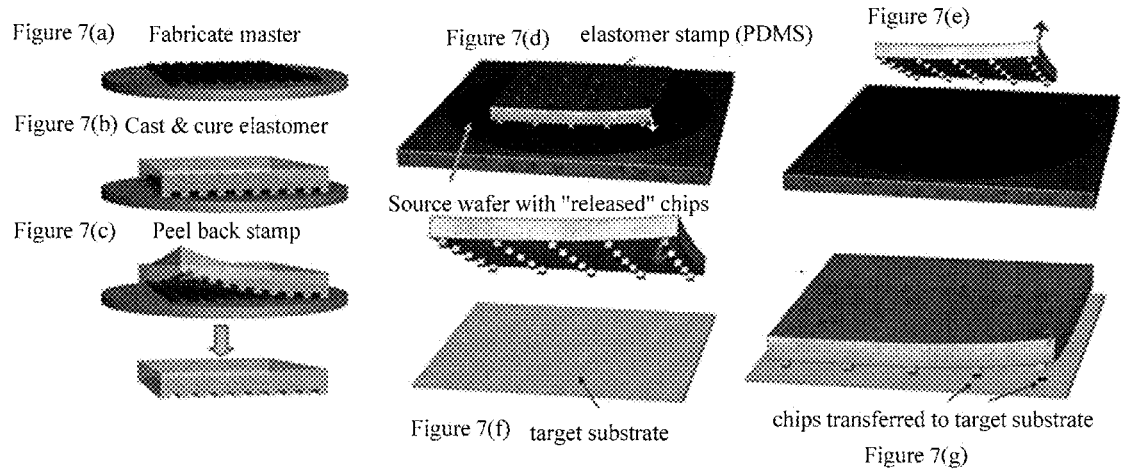

PHOTONIC INTEGRATED CIRCUIT

CROSS-REFERENCE TO RELATED APPLICATIONS

This application claims priority to European Patent Application No. 16204372.3, filed on Dec. 15, 2016, which is hereby incorporated by reference in its entirety

TECHNICAL FIELD

This invention relates to a photonic integrated circuit (PIC).

BACKGROUND

Integrated circuits (ICs) can be monolithically fabricated on substrates such as silicon (Si) or silicon-based substrates or wafers. Multiple layers can be deposited on the substrate to build up the desired structure. Silicon-based materials are widely used for electronic integrated circuits (EICs) since they offer considerable economic and technical advantages over alternative options. Silicon-based materials are suitable for constructing three-dimensional structures with low noise and high speed electrical performance.

Rapid growth in data communications has led to the development of photonic integrated circuits (PICs): integrated circuits that are configured to operate using optical signals rather than electrical signals. Optical signals can increase speed and provide more bandwidth compared with their electrical equivalents. Silicon offers a wide band infrared transparency, which makes it an option for constructing photonic integrated circuits. However, whilst its transparency makes it suitable for constructing passive photonic components, such as waveguides, and silicon can be used to construct active devices like modulators and detectors. The performance of silicon based actives is typically inferior to what can be achieved with actives fabricated in III-V materials.

It is possible to form monolithically integrated photonic integrated circuits using III-V wafers (e.g., InP or GaAs). However, this approach is very expensive compared to the silicon-based alternatives. III-V ingots (and hence wafers cut from those ingots) are more limited in size than silicon ingots. Therefore, there is less semiconductor area to work with when processing III-V materials compared with silicon-based materials. This leads to increases in cost when attempting to produce III-V devices in bulk.

Methods to integrate layers of III-V onto silicon wafers are well known. But techniques used to date create a non-planar surface in the region of the III-V material. This makes it difficult to closely integrate the electronics associated with the active devices. Typically the advantages which come from close integration of the electronics and photonics have only been realised with silicon photonics technologies where the modulators and detectors are fabricated in silicon.

It is an object of embodiments of the invention to provide an improved photonic integrated circuit and mechanisms for enabling such a circuit to be produced.

SUMMARY OF THE INVENTION

The foregoing and other objects are achieved by the features of the independent claims. Further implementation forms are apparent from the dependent claims, the description and the figures.

According to a first aspect, a photonic integrated circuit is provided that comprises a substrate and a passive layer, which is formed on the substrate and incorporates a passive photonic device. The circuit also comprises a layer of III-V material. The layer of III-V material is arranged in a recess of the passive layer and incorporates an active photonic device. The layer of III-V material is configured such that light can be transferred between the passive photonic device and the active photonic device. This photonic integrated circuit provides the advantages of an active device formed from III-V material in an arrangement that is easily planarised, which enables close integration between the active device and electrical components.

The photonic integrated circuit may include an electrical redistribution layer in contact with the layer of III-V material. The electrical redistribution layer may have a substantially flat surface for facilitating close integration of the active photonic device with an electronic integrated circuit. The substantially flat surface allows the electronic integrated circuit to be placed either directly above or so close to the III-V material that the distance between the electronic chip interface (bond pad) and an active device created with the III-V material may be less than 40 um.

This close proximity reduces parasitic capacitance and thus potentially enables faster operation of both circuits with lower power consumption.

The transfer of light between the passive photonic device and the active photonic device is achieved through one of: a grating coupler; evanescent coupling; butt coupling; and an adiabatic coupling. Any of these arrangements, when properly designed, can achieve effective coupling between the active and passive devices.

The layer of III-V material may be between 1 and 5 µm thick. This thickness provides sufficient structural stability to allow effective transfer printing of the layer of III-V material to the integrated circuit whilst being thin enough to allow easy planarization.

According to a second aspect, a method is provided for forming a device on a photonic integrated circuit. The method comprises forming a layer of III-V material on a substrate. It also comprises transferring that layer of III-V material from the substrate to the photonic integrated circuit by detaching it from the substrate and printing it in a recess of the photonic integrated circuit. This method of transferring the layer of III-V material allows thin layers of III-V material to be transferred to a photonic integrated circuit, enabling that circuit to be formed predominantly from non-III-V material (and therefore using larger diameter and cheaper wafers) while still retaining the advantages of III-V material for the active photonic devices in the circuit.

The method may comprise depositing an electrical redistribution layer which connects to the layer of III-V material in the recess. The deposition of the electrical redistribution layer enables the active device incorporated in the III-V material to connect to one or more electrical components.

The method may comprise planarising across the recess to create a substantially flat surface. This facilitates close integration of the photonic integrated circuit with an electronic integrated circuit.

The method may comprise contacting the layer of III-V material with a stamp. It may also comprise removing the layer of III-V material from the first substrate by moving one of the stamp and the first substrate relative to the other, whereby the layer of III-V material adheres to the stamp and is detached from the first substrate. This provides a relatively simple and effective mechanism for lifting the III-V material from the source substrate.

The method may comprise depositing the layer of III-V material on the photonic integrated circuit by contacting the layer of III-V material, which is adhered to the stamp, with the photonic integrated circuit and moving one of the stamp and the photonic integrated circuit relative to the other. The layer of III-V material is detached from the stamp and remains in contact with the integrated circuit. This provides a relatively simple and effective mechanism for detaching the III-V material from the stamp and depositing it on the photonic integrated circuit.

The stamp may have a speed-dependent adhesion property, whereby the stamp shows a different adhesion with a layer of III-V material when the stamp moves away from that layer of III-V material at a first speed than when the stamp moves away from that layer of III-V material at a second speed, which is different from the first speed. This provides a straightforward mechanism for allowing the III-V material to be transferred from one substrate to another by enabling it to be picked up from one location and deposited in another.

The method may comprise the stamp removing the layer of III-V material from the first substrate by the stamp and the first substrate moving apart at a first speed and the stamp depositing the layer of III-V material on the second substrate by the stamp and the integrated circuit moving apart at a second speed, which is different from the first speed. The second speed may be slower than the first speed. Thus by controlling the speed of the stamp, the III-V material can be both picked up and deposited.

The photonic integrated circuit may include a layer of non III-V material formed on a second substrate. The method may comprise transferring the layer of III-V material to a recess in that layer of non III-V material. This arrangement permits the photonic integrated circuit to be formed from a combination of materials, such as III-V and non III-V materials, and thus exploit the benefits of both.

The method may comprise fabricating a device from III-V material on a release layer that is formed on the substrate. It may also comprise etching around part of the perimeter of the device to expose the release layer. The method may also comprise etching the release layer that is sandwiched between the device and the first substrate to obtain a layer of III-V material that is spaced from the first substrate but tethered to it. The etching of the release layer allows the device to be retained in position, but easily removed when desired.

BRIEF DESCRIPTION OF THE DRAWINGS

The present invention will now be described by way of illustrative examples with reference to the accompanying drawings. In the drawings:

FIGS. 7(a) to (g) illustrate stages in a transfer printing process; and

DETAILED DESCRIPTION OF THE EMBODIMENTS

Figure 1:
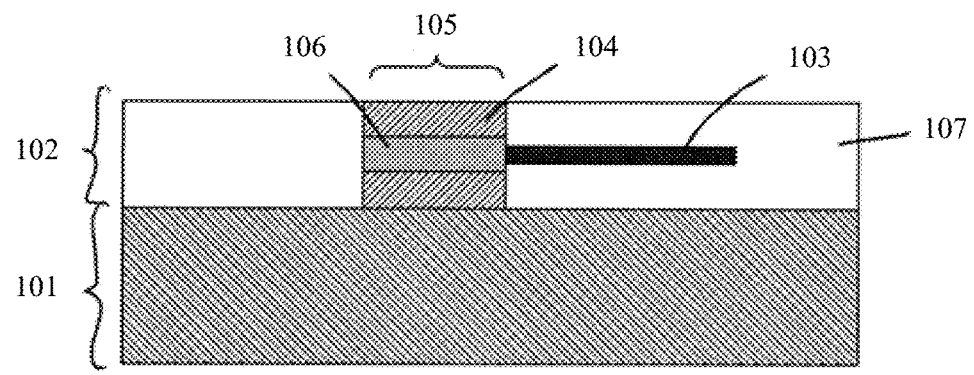
FIG. 1 shows an example of a photonic integrated circuit according to an embodiment of the invention.

An example of a photonic integrated circuit is shown in FIG. 1. The integrated circuit comprises a substrate 101 and a series of patterned layers 102, which are formed on the substrate creating passive optical structures. We refer to this series of layers as the "passive layer". The passive layer may include a dielectric 107 and includes a passive photonic device or component. FIG. 1 shows a waveguide 103, which is itself a passive photonic device and can also create larger passive optical devices and optical interconnect in combination with the dielectric layer (which forms the under and overclad layers of the waveguide shown in FIG. 1). The integrated circuit also comprises a layer of III-V material 104, which is arranged in a recess 105 of the passive layer. The layer of III-V material 104 incorporates an active photonic device 106. The layer of III-V material 104 is configured to allow light to be transferred between the passive photonic device and the active photonic device.

In some implementations, the layer of III-V material will only implement the active device—so the layer of III-V material forms the active device—but in other examples the layer of III-V material may incorporate additional devices. For example, in the evanescent coupling arrangement illustrated in FIG. 3(c) the layer of III-V material implements a passive taper in addition to an active device.

The passive layer does not comprise III-V material and is likely to comprise at least one material with medium or high refractive index (e.g. an RI in the range 1.7-3.5) which is commonly available in CMOS foundries (e.g. silicon, silicon nitride, silicon oxynitride, etc). The substrate may also comprise a silicon-based material.

An active photonic device is typically capable of generating, manipulating or detecting light. Active photonic devices are usually provided with some form of electrical input or output. This enables electronic signals to be converted into light and vice versa. Examples of active photonic devices include lasers, which generate photons in response to an electrical trigger, and electro-absorption modulators (EAM), which can be used to modulate the intensity of light via an electrical voltage.

Passive photonic devices do not need to be provided with an electrical input or output. Passive photonic devices are generally configured to process light in a fixed way irrespective of any voltage or current. For example a wavelength filter may be transparent to light of a given wavelength but block or attenuate light outside the specified wavelength range. Another example is optical interconnect (e.g. a waveguide), which is configured to guide an optical signal along a path. Another example of a passive device is a beam splitter, which is configured to split one optical signal into two or more separate optical signals.

The photonic integrated circuit in FIG. 1 combines the advantages of an active device formed from III-V material with a bulk of the photonic integrated circuit being able to be formed using a different, cheaper material. For example, the bulk of the photonic integrated circuit may be formed from materials typically found in CMOS processing, which is a mature, cost-effective technology. Locating the III-V active in a recess of the passive layer (e.g. in a recess of the cladding surrounding a passive device) is particularly advantageous because it enables the formation of a relatively flat surface above the recess. This facilitates close integration of the active photonic device with one or more electrical components. This minimises parasitic capacitances between the photonic and electronic integrated circuits that would otherwise limit the ability of the circuit to achieve high speed/high frequency processing.

Figure 2:
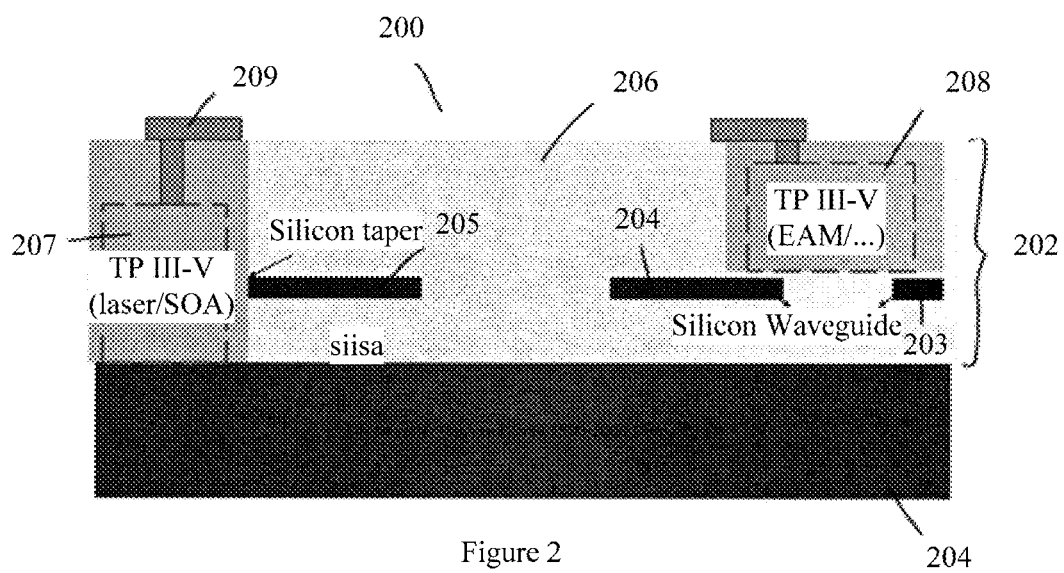
FIG. 2 shows a more detailed example of a photonic integrated circuit according to an embodiment of the invention.

A more detailed example of a photonic integrated circuit is shown in FIG. 2. The photonic integrated circuit 200 comprises a substrate 201 formed from a high resistivity silicon wafer. The passive layer 202 is formed from a layer of silica 206 and includes three silicon waveguides 203, 204 and 205. The circuit also includes two layers of III-V material 207, 208, each of which is located in a respective recess within the passive layer 202 of the cross-section illustratively depicted in FIG. 2. The layers of III-V material 207, 208 may be, for example, between 1 and 5 μm thick. The first layer of III-V material 207 is configured as a laser. It is butt coupled to the waveguide 205 incorporated within the passive layer 202, which enables the laser to transfer light to the waveguide 205. The second layer of III-V material 208 is configured as an EAM and is adiabatically coupled to the waveguides 204, 203 incorporated within the passive layer 202. In the example of FIG. 2, all waveguides 203, 204 and 205 are surrounded by the layer of silica (cladding) 206. This similarly enables the EAM and the waveguides to transfer light between them. An electrical redistribution layer (represented by interconnect 209) contacts the active devices of the layers of III-V material 207 and 208, enabling them to be connected to electrical components in an electronic integrated circuit.

The recesses are spaces or cavities in the passive layer that are formed due to variations in the depth of the passive layer (e.g. variations in depth of the silica cladding 206 shown in FIG. 2). The recesses may have different depths. For example, the recess in which the layer of III-V material 207 is deposited represents a hole in the passive layer 202, meaning that the recess extends through the dielectric to the substrate 201. The layer of III-V material 208 is located in a recess that is shallower, and thus represents a depression rather than a hole in the passive layer 203. The depth of the recess containing the layer of III-V material may be selected in accordance with the type of active device that is to be formed by the layer of III-V material and the type of coupling that is desired to use to transfer light between that active device and the passive device incorporated in the passive layer. The butt coupling scheme as illustrated has the advantage of better thermal power dissipation and is therefore usually preferred for active devices which generate a lot of heat (e.g. laser, SOA). However, the evanescent coupling depicted for the EAM has generally the lowest coupling loss and is therefore preferred if the active device does not generate a lot of heat.

The active and passive devices may be configured to transfer light between them via any suitable coupling. Three possible examples include a grating coupling, evanescent coupling, butt coupling and an adiabatic coupling. Some of these couplings are illustrated in FIG. 3.

Figure 3A:
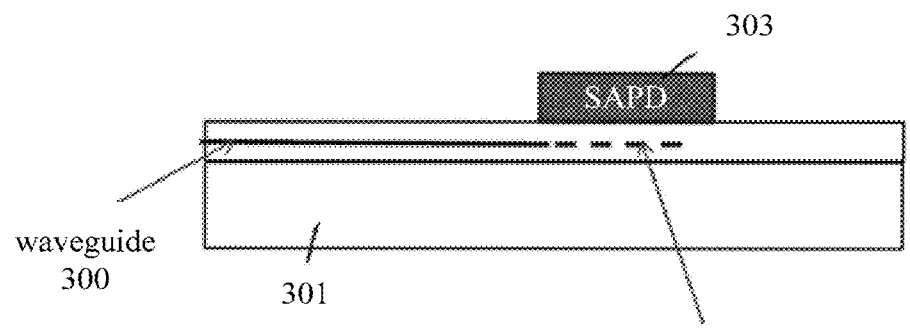
FIGS. 3(a) to (c) illustrate examples of different coupling schemes for transferring light between passive and active photonic components.

FIG. 3 shows three examples of how active devices can be coupled with passive devices. In FIG. 3(a), a waveguide 300 is provided on a substrate 301. A grating coupler 302 is located at one end of the waveguide 300. An active device 303 (shown here as a surface area photodetector (SAPD) but other examples are also possible) is located on the structure above the grating coupler 302 to permit coupling of optical signals between the active device 303 and the waveguide 300.

Figure 3B:
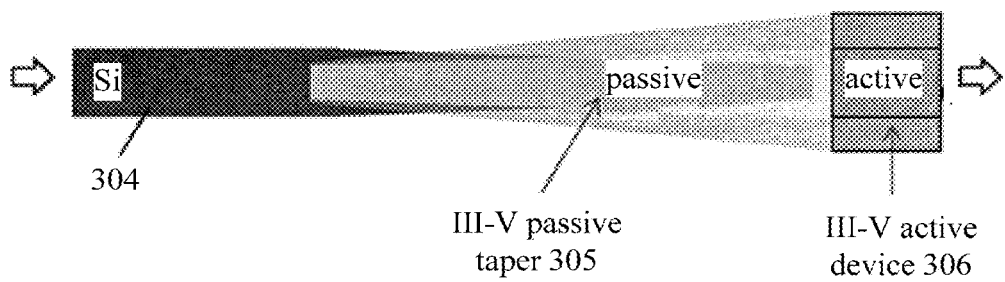

In FIG. 3(b), a passive device (which is a waveguide in this example) formed from a silicon layer 304 is coupled to an active device 306 formed from a III-V material via a taper 305. The taper 305 is also formed from III-V material and is a passive device. The taper could also be formed from other material. This arrangement permits evanescent coupling of optical signals between the active and passive devices.

Figure 3C:
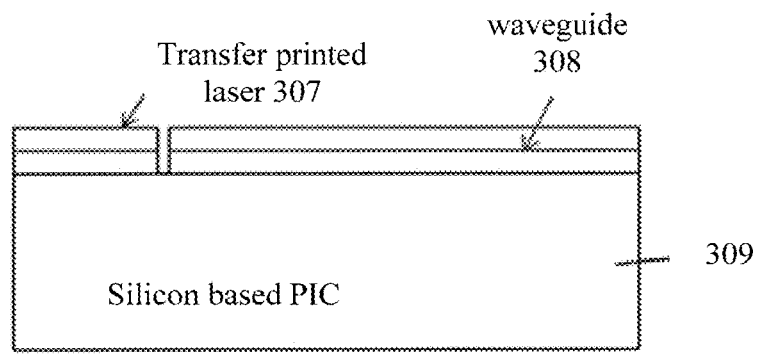

In FIG. 3(c), an active device 307 (which is a laser in this example) and a passive device 308 (which is a waveguide in this example) are provided on a substrate 309 (which is silicon-based in this example). The active device 307 and the passive device 308 are aligned, with their facets facing one another. This arrangement permits butt-coupling of optical signals between the active device 307 and the passive device 308.

An example of a process for fabricating a photonic integrated circuit comprising both active and passive devices is shown in FIGS. 4(a) to (d). These figures reference specific materials, but it should be understood that the illustrated techniques are not restricted to the particular materials detailed in the figures.

Figure 4A:
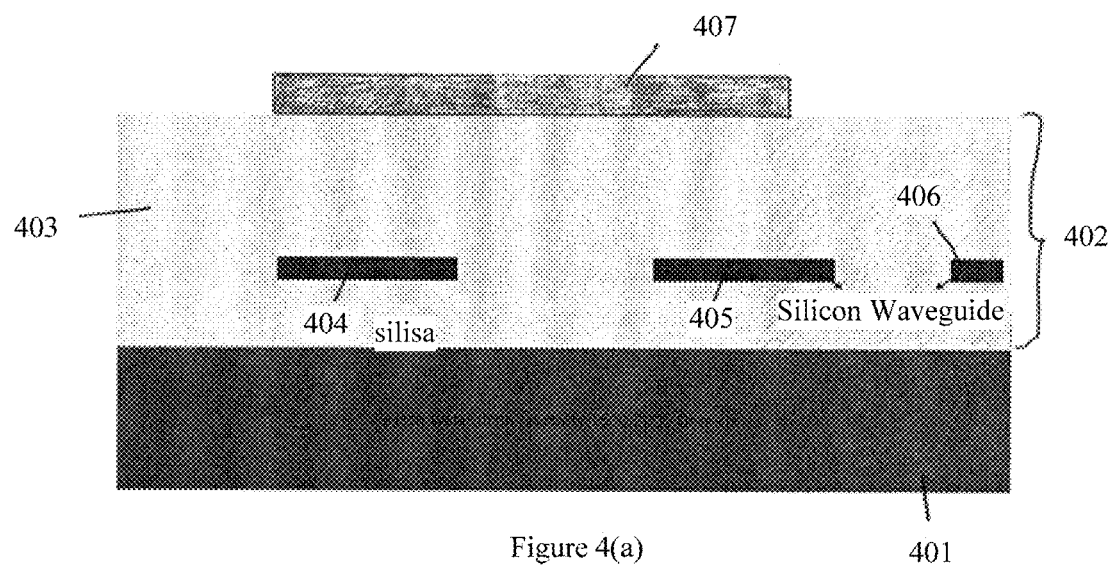
FIGS. 4(a) to (d) illustrate steps in an example process for fabricating a photonic integrated circuit.

In the example illustrated in FIG. 4(a), a silica layer 403 is fabricated on a silicon substrate 401. The silica layer encapsulates three waveguides 404, 405, and 406. The waveguides are also formed from silicon. A mask 407, such as an etch mask, is shown on the upper surface of the structure. The mask permits selective removal of silica from the passive layer 402. In one example, material of the silica layer 403 is etched in portions that are not covered by the mask. The etch can be a wet chemical etch, a reactive ion etch or any other suitable etch. An etch stop layer (not shown) may be incorporated in the silica layer above waveguides 405, 406 to prevent the etch going too deep whilst the silica is removed all the way to the substrate.

Figure 4B:
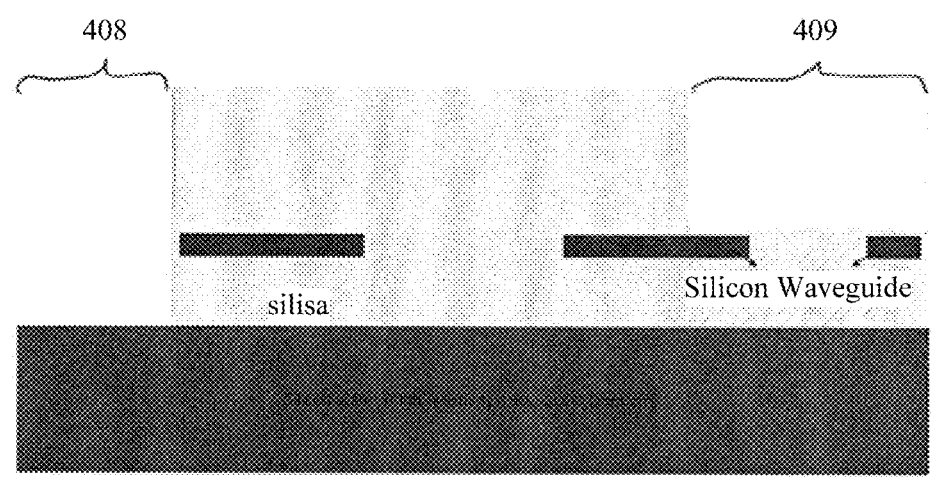

FIG. 4(b) illustrates the structure following the etch, when the resulting structure comprises two recesses 408, 409. Any etch stop layer which may have been used has been removed. In the example of FIG. 4(b), one recess (408) is deeper than the other recess (409). It should be understood that any number and arrangement of recesses can be provided using this process. It is also understood that the process may be arranged so that only recesses on one depth are etched in the first step. Following the transfer of the III-V material and subsequent planarization (see next step) the masking and etch step may be repeated for recesses of a different depth.

Figure 4C:
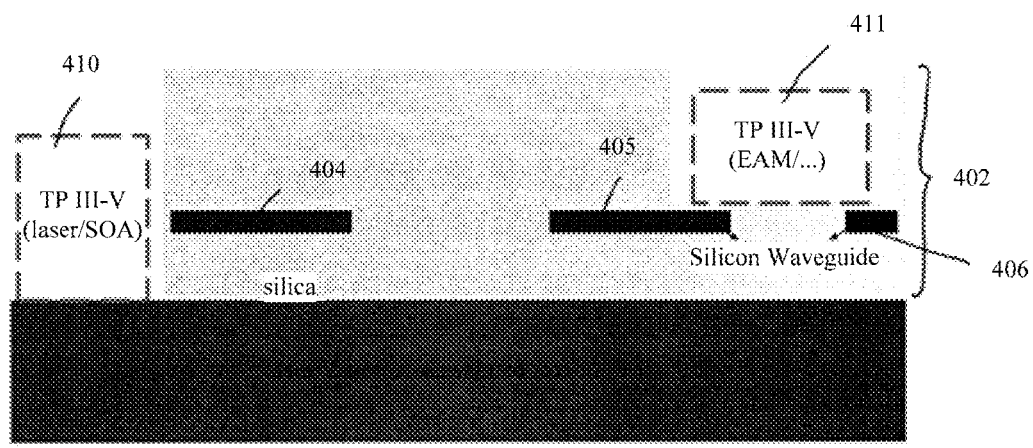

A layer of III-V material is then deposited in one or more of the recesses 408 and 409, as shown in FIG. 4(c). In FIG. 4(c) each layer of III-V material 410 and 411 forms a respective active device. For example, the layer 410 forms a laser and the layer 411 forms an EAM. Each layer of III-V material is positioned slightly differently with respect to its respective waveguide in the passive layer 402. The relative positioning between an active and passive device (such as a waveguide) is dependent on which type of coupling that is used between them. For example, the active device formed of the layer 410 is located end-on to a passive waveguide (404). This arrangement permits butt-coupling of optical signals between the two devices. The active device formed of the layer 411 is located above two passive tapers (waveguides 405, 406). This arrangement permits coupling using evanescent coupling.

Figure 4D:
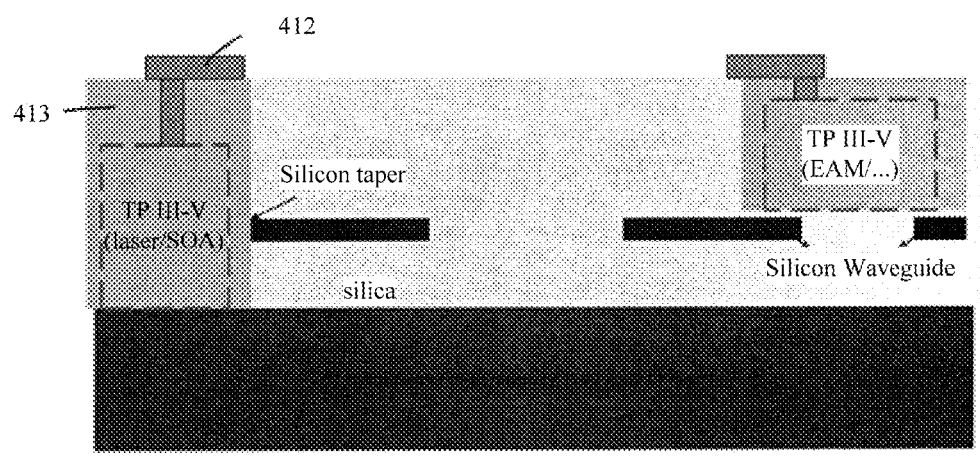

In FIG. 4(d) a dielectric layer 413 has been deposited on each of the active devices (formed of layers 410 and 411)

and then planarised. The dielectric layer 413 could, for example, be formed of silica. An electrical redistribution layer has also been added on top of the active devices formed of the layers 410 and 411, as represented by interconnect 412. The electrical redistribution layer preferably penetrates through the protective layer around the active device to contact the active device. The electrical redistribution layer could, for example, be formed of metal.

Preferably the upper surface of the layers of III-V material in the different recesses are designed to be as close as possible to co-planar with each other. In this way, the distance from the upper surface of the dielectric layer to the III-V material is comparable across the circuit. This makes via hole formation easier, as shown in FIG. 4(d). Planarization of the upper surface and the subsequent deposition of a redistribution layer help to create a substantially flat surface for the photonic integrated circuit that facilitates close integration of the circuit, and particularly its active devices, with one or more electrical components. In some embodiments, it is possible to achieve a topography (after deposition of an electrical redistribution layer over the active device and planarization) that has local height differences of less than 5 µm, and even less than 1 µm. It may be possible to integrate the photonic integrated circuit so closely with an electronic integrated circuit that an upper surface of the electrical redistribution layer can be within 40 µm of an electrical component.

Note that terms such as 'upper', "on top of" and 'depth' are used above because they are applicable to the specific orientation of the integrated circuit that is illustrated in FIGS. 4(a) to (d). It will be understood that the integrated circuit is not limited to the specific orientation shown in the figures. This terminology should therefore be understood as referring to a relative relationship between the layers of the integrated circuit, whatever its orientation, rather than defining an absolute relationship that would limit the integrated circuit to having a specific orientation.

Figure 5:
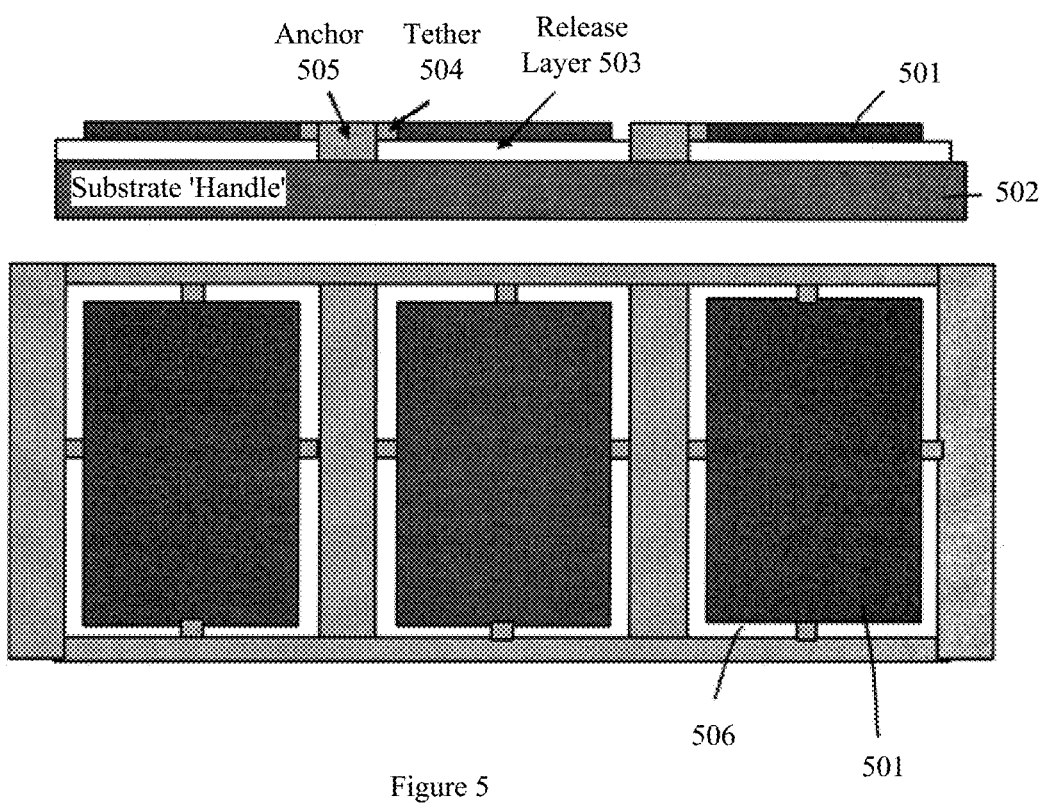
FIG. 5 illustrates an example of a fabrication structure comprising an active device.

FIG. 5 shows two perspectives (cross-section and plan views) of an example of an active device during fabrication. The upper portion of FIG. 5 shows a cross-sectional side view of the fabrication structure, while the lower portion of FIG. 5 shows the fabrication structure from above. To facilitate the subsequent removal of the active device from the substrate 502, a release layer 503 is preferably formed on the substrate. The release layer can be formed as a continuous layer and then divided into separate regions, e.g. by selective etching. Alternatively, the release layer can be formed directly as separate regions, for example by depositing material onto the substrate through a mask (not shown). The different regions of the release layer may be separated by portions 505 of a material that is different from that of the release layer. These portions can be termed "anchors". The anchors might conveniently be formed from the same material as the substrate.

Active devices 501 are formed on the release layer 503. After fabrication of the active devices, a trench 506 is etched around each active device, exposing the release layer 503. The active devices are left joined to the anchor portions 505 by tethers (or "bridges") 504. The exposed release layer can then be etched away both around and underneath the active devices. This results in the active devices being held spaced from the substrate 502 by the tethers. The active devices can then be detached from the substrate for depositing in the recesses of the dielectric layer in the photonic integrated circuit.

Figure 6A:
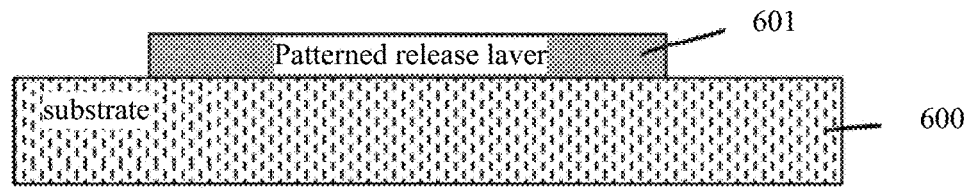
FIGS. 6(a) to (c) illustrate steps in an example process for fabricating a photonic integrated circuit.
Figure 6B:
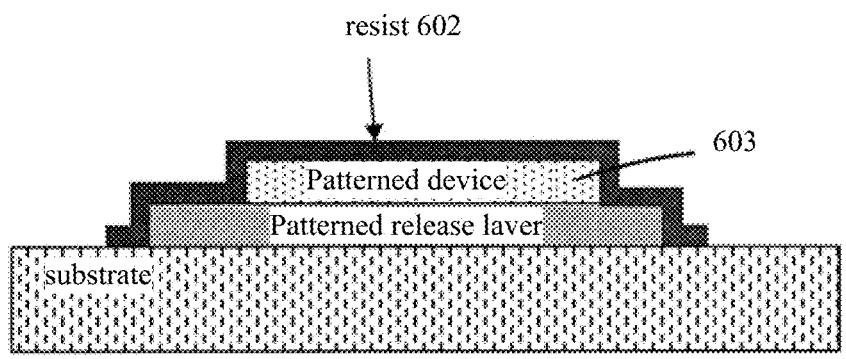
Figure 6C:
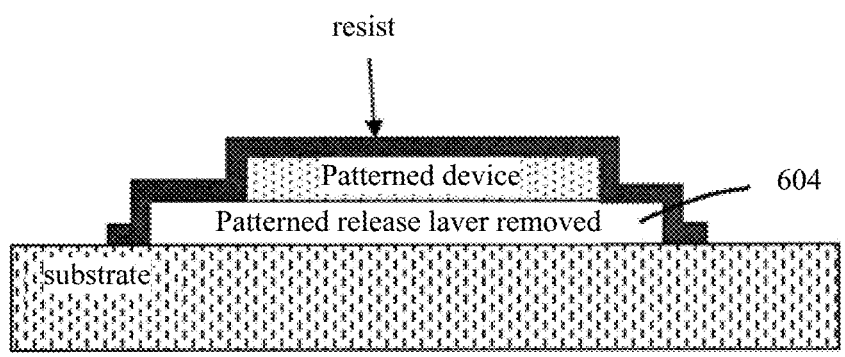

Another option is for the release layer to be a continuous layer formed on a substrate. This is shown in FIGS. 6(a) to (c). In this case the 'anchor' region should be patterned creating separate islands of release layer 601 for each device. Resist 602 is then used to 'tether' the active device 603 to the substrate 600. The resist coverage of the release layer is not continuous, allowing a release etch chemical to remove the release layer 604. With properly designed resist tethers the device can be reliably picked from the substrate and transfer printed to a target wafer.

One option for transferring the active devices from the fabrication structure illustrated in FIGS. 5, 6(a) and 6(b) to recesses in the passive layer of a photonic integrated circuit is via a process called transfer printing. Transfer printing has not previously been used for active devices formed of III-V material. However, a technique is described herein to achieve this whilst maintaining the performance of the active devices.

An example of a process for transferring a layer of III-V material from one location to another via transfer printing is shown in FIGS. 7(a) to (g). FIGS. 7(a) to 7(c) illustrate a process of forming a stamp that will be used to detach layers of III-V material from one substrate and to move them to another substrate. In FIG. 7(a), a master is fabricated, which has a structure inverse to that of the desired stamp. The stamp is then formed by using the master as a template. For example, as shown in FIGS. 7(b) and (c), material for forming the stamp can be cast and cured from the master. Once cured, the stamp can be removed from the master. In this example the stamp comprises a series of protrusions with a regular lattice arrangement, which can be used to produce a similar lattice arrangement of III-V material (as explained below).

In a preferred example, the stamp is formed from a material that displays a speed-dependent adhesion property. In one example, the stamp may comprise an elastomeric material such as polydimethylsiloxane (PDMS). This material has useful visco-elastic properties that can be exploited in the transfer printing process. In particular, PDMS offers the ability to selectively tune the adhesion between the stamp and a printable element (such as a layer of III-V material) by varying the speed of the stamp relative to the printable element. This speed-dependent adhesion property is illustrated in FIGS. 7(a) and (b).

Figure 8A:
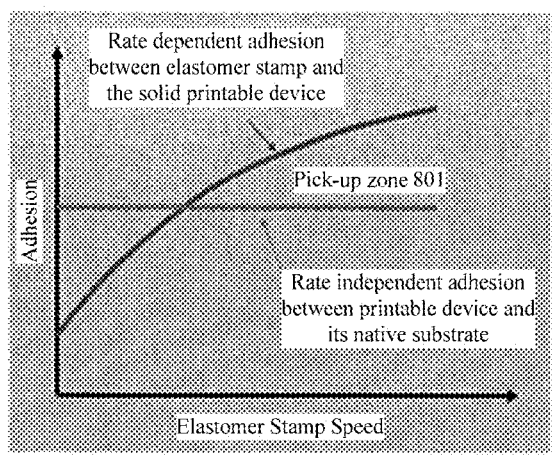
FIGS. 8(a) and (b) illustrate the dependence of an adhesive property of a transfer printing stamp on speed of movement of the stamp.

FIGS. 8(a) and (b) are both graphs of adhesion versus elastomer stamp speed, which illustrate how the rate dependent adhesion between the elastomer and the solid elements allow for transferring III-V material from one substrate to another. When the stamp is moved quickly away from a bonded interface, the adhesion is large enough to "pick" the printable elements away from their native substrates. Conversely, when the stamp is moved slowly away from a bonded interface the adhesion is low enough to "let go" or "print" the element onto a foreign surface. This is represented in the figures by "pick-up zone" 701 and "print zone" 702 respectively. This adhesive effect is due to Van der Waals forces between the III-V material and the surface of the stamp.

Figure 8B:
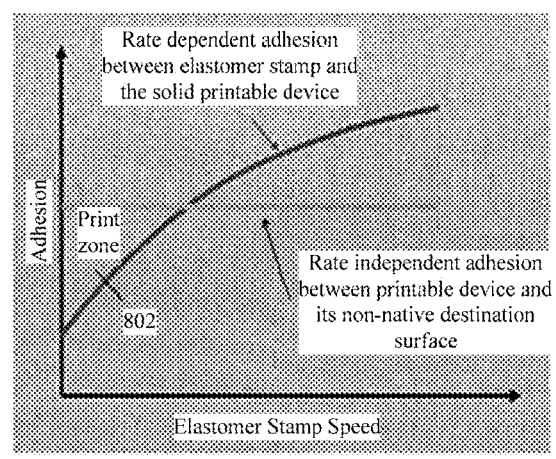

An example of a transfer printing process that makes use of this speed-dependent adhesion property is illustrated in FIGS. 7(d) to (g). In FIG. 7(d) a stamp is moved towards a first substrate on which a plurality of active devices formed from III-V material have been fabricated. The upper surface of the active devices attach to the lower surface of the stamp via Van der Waals forces. To detach the active devices from the first substrate, the stamp is moved away from the first substrate at a first speed (FIG. 7(e)). This speed is high enough to ensure that the adhesion between the stamp and the active devices is sufficient to break any attachment between those active devices and source substrate (e.g. by breaking the tethers 504). The first speed is such that the adhesion is in the 'pick up' zone 701 of FIG. 8(*a*).

To 'print' the active devices on a target substrate, the stamp is moved towards the target in a position that causes the active devices to engage with any recesses formed in the surface of that target (FIG. 7(*f*)). The printing process is completed by removing the stamp, leaving the active devices in position in the recesses in the target substrate. The stamp is moved away from the second substrate at a second speed, which is low enough to ensure that the adhesion between the stamp and the active device is less than the adhesion between the active device and the target substrate. The second speed is such that the adhesion is in the 'print' zone 702 of FIG. 8(*b*).

Whilst the process of transfer printing has been described above in terms of a stamp moving with respect to stationary substrates, it should be understood that it is the relative movement between the stamp and the respective substrates that is important and thus the substrates could equally be moved with respect to the stamp, or both could move.

The techniques discussed herein may be used to form any type of device formed from III-V material. They enable a thin layer of III-V material (for example between 1 and 5 µm in thickness) to be transferred to silicon-based wafer and specifically into a recess in a passive layer formed on that wafer. The transfer of III-V material into recesses allows for straightforward planarization and the formation of a substantially flat surface above the III-V layer. This flat surface makes it possible to add electrical components very close to the III-V active devices (e.g. within 40 µm), which facilitates two dimensional or three-dimensional integration of an electronic integrated circuit with the photonic integrated circuit. This close integration of electronics and photonics brings significant performance advantages, particularly due to lower parasitic capacitances and inductances. Such close integration has only previously been possible with silicon-on-insulator (SOI) actives, but III-V actives offer significant performance advantages over SOI actives for some applications. For example:

an EAM is possible at 1310 nm;

A higher figure of merit (FOM) is available for III-V EAM as it offers a much higher extinction ratio;

An integrated semiconductor optical amplifier chip can be implemented, providing compensation for optical losses;

A III-V Mach Zehender interferometer (MZi) modulator can be shorter than a SOI version and offer higher extinction ratio for the same drive voltage;

A III-V detector can handle more power than a germanium (Ge) photodetector (PD);

III-V waveguide detector can use a much wider waveguide compared to a germanium photo diode, which can be helpful for creating a flat-top demultiplexor with an AWG or Echelle grating structure by using multi-mode output waveguides.

The structures and techniques described herein combine the advantages of lower parasitics with the performance advantages of III-V actives. Examples of applications for the photonic integrated circuits described herein include any that would benefit from reduced crosstalk, single chip transceivers, and/or a reduced capacitance between a driver and modulator for reduced power consumption.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A photonic integrated circuit comprising:
   a semiconductor substrate;
   a passive layer, which is formed on the semiconductor substrate and incorporates a passive photonic device; and
   a layer of III-V material arranged in a recess of the passive layer,
   wherein the layer of III-V material incorporates an active photonic device, and
   wherein the layer of III-V material is configured such that light can be transferred between the passive photonic device and the active photonic device, and
   wherein a surface of the layer of III-V material over the recess is planarized, after arranging the layer of III-V material in the recess, to create a substantially flat surface comprising both the passive layer and the layer of III-V material of the photonic integrated circuit, and
   wherein transferring light between the passive photonic device and the active photonic device is achieved through an evanescent coupling.

2. The photonic integrated circuit of claim 1, further comprising an electrical redistribution layer in contact with the layer of III-V material.

3. The photonic integrated circuit of claim 2, wherein the photonic integrated circuit is configured to be closely integrated with an electronic integrated circuit, and
   wherein a surface of the electrical redistribution layer is within 40 µm of a surface of an electrical component formed on the electronic integrated circuit.

4. The photonic integrated circuit of claim 3 wherein the electronic integrated circuit is a transimpedance amplifier (TIA) or a modulator driver.

5. The photonic integrated circuit of claim 1, wherein the layer of III-V material is between 1 and 5 µm thick.

6. The photonic integrated circuit of claim 1 wherein the layer of III-V material is arranged in the recess of the passive layer, during fabrication, by:
   forming the layer of III-V material on a substrate;
   transferring the layer of III-V material from the substrate to the photonic integrated circuit by detaching the layer of III-V material on the substrate, from the substrate; and
   printing the detached layer of III-V material in a recess of the photonic integrated circuit.

7. The photonic integrated circuit of claim 6 wherein the transferring comprises:
   contacting the layer of III-V material on the substrate with a stamp; and
   removing the layer of III-V material from the substrate by moving at least one of the stamp and the substrate relative to the other,
   where, during the removing, the layer of III-V material adheres to the stamp and is detached from the substrate.

8. The photonic integrated circuit of claim 7, wherein the printing comprises depositing the detached layer of III-V material on the photonic integrated circuit by:

contacting the detached layer of III-V material, which is adhered to the stamp, with the photonic integrated circuit, and removing the layer of III-V material from the stamp by moving at least one of the stamp and the photonic integrated circuit relative to the other, and where, during the removing the layer III-V material from the stamp, the layer of III-V material is detached from the stamp and remains in contact with the photonic integrated circuit.

9. The photonic integrated circuit of claim 7, wherein the stamp has a speed-dependent adhesion property, whereby the adhesive shows a different adhesion with a layer of III-V material when the stamp moves away from that layer of III-V material at a first speed than when the stamp moves away from that layer of III-V material at a second speed that differs from the first speed.

10. The photonic integrated circuit of claim 1, further comprising a layer of non III-V material that, during fabrication, is formed on a second substrate, where, during fabrication of the photonic integrated circuit, the layer of III-V material is transferred to a recess in the layer of non III-V material formed on the second substrate.

11. The photonic integrated circuit of claim 1, further comprising:

a first tapering of a waveguide defined in the layer of III-V material; and a corresponding second tapering of a waveguide formed in the passive layer.

12. The photonic integrated circuit of claim 11, wherein the first tapering and the corresponding second tapering are configured to facilitate an adiabatic coupling between the layer of III-V material and the passive layer.

13. The photonic integrated circuit of claim 1, wherein the active photonic device is located above the passive photonic device, with respect to the semiconductor substrate positioned below the passive layer and the layer of III-V material.

14. The photonic integrated circuit of claim 13, wherein the active photonic device comprises an electro-absorption modulator (EAM).

15. The photonic integrated circuit of claim 13, wherein the active photonic device comprises a laser.

16. The photonic integrated circuit of claim 13, wherein the active photonic device comprises a photo-detector.

17. The photonic integrated circuit of claim 13 where the passive layer has a refractive index within a range of 1.7-3.5.

* * * * *